(12) United States Patent
Willey

(10) Patent No.: US 8,427,204 B2
(45) Date of Patent: Apr. 23, 2013

(54) MIXED-MODE INPUT BUFFER

(75) Inventor: Aaron Willey, Boise, ID (US)

(73) Assignee: Nanya Technology Corp., Kueishan, Tao-Yuan Hsien (TW)

( * ) Notice: Subject to any disclaimer, the term of this patent is extended or adjusted under 35 U.S.C. 154(b) by 0 days.

(21) Appl. No.: 12/829,403

(22) Filed: Jul. 2, 2010

(65) Prior Publication Data

US 2012/0001663 A1   Jan. 5, 2012

(51) Int. Cl.
*H03K 5/153*      (2006.01)
(52) U.S. Cl.
USPC .................................. 327/73; 327/74; 327/63
(58) Field of Classification Search .............. 327/73–75, 327/63, 68
See application file for complete search history.

(56) References Cited

U.S. PATENT DOCUMENTS

| | | | | |
|---|---|---|---|---|
| 5,901,102 A * | 5/1999 | Furutani | ........................ | 365/226 |
| 6,154,065 A * | 11/2000 | Komatsu | ......................... | 327/56 |
| 6,157,221 A * | 12/2000 | Gorham et al. | ................. | 327/75 |
| 6,166,521 A * | 12/2000 | Mercer et al. | ................. | 320/125 |
| 6,281,731 B1 * | 8/2001 | Fifield et al. | ..................... | 327/205 |
| 6,707,321 B2 * | 3/2004 | Cho et al. | ......................... | 327/51 |
| 6,879,198 B2 * | 4/2005 | Kumar et al. | ................. | 327/206 |
| 6,952,091 B2 * | 10/2005 | Bansal | ........................... | 323/277 |
| 7,154,318 B2 * | 12/2006 | Sharma et al. | ................ | 327/206 |
| 7,436,732 B2 * | 10/2008 | Hirobe | ........................ | 365/226 |
| 7,652,535 B2 * | 1/2010 | Singh et al. | .................... | 330/258 |
| 7,733,179 B2 * | 6/2010 | Forejt | ............................ | 330/258 |
| 7,843,174 B2 * | 11/2010 | Ting | ............................... | 320/164 |
| 2004/0155689 A1 | 8/2004 | Kumar | | |
| 2004/0178778 A1 * | 9/2004 | Bansal | ......................... | 323/274 |
| 2007/0206427 A1 * | 9/2007 | Hirobe | ..................... | 365/189.09 |

* cited by examiner

*Primary Examiner* — Ryan Jager
(74) *Attorney, Agent, or Firm* — Winston Hsu; Scott Margo

(57) ABSTRACT

An input buffer with a reduced sensitivity to an externally generated reference voltage includes: a first input coupled between a first load and ground, the first input being an externally generated reference voltage; a second input coupled between a second load and ground, for generating an output; and a third input coupled in parallel to the first input, the third input being an internally generated reference voltage. The output switches between high and low or vice versa when the second input exceeds a switching point which is an average of the first input and the third input according to the relative size of the first input and the third input.

8 Claims, 9 Drawing Sheets

MIXED-MODE INPUT BUFFER

BACKGROUND OF THE INVENTION

1. Field of the Invention

The present application relates to input buffers, and more particularly, to input buffers with reference voltage mixing.

2. Description of the Prior Art

Generally, an input buffer on an integrated circuit receives an input from an external source and generates an output based on that input, the output being used within the integrated circuit. Existing single ended input buffers have a first input and a reference voltage. When the input signal exceeds the reference voltage, the output of the buffer will change (from low to high or high to low). Because the reference voltage is externally generated, it may be noisy or undergo some fluctuation. In such cases, the buffer output may switch erroneously.

Because the switch point of input buffer is tied to the reference voltage signal, variation in the voltage level of the reference voltage signal may result in switching at the wrong time—too early, too late, or outside of a timed switching window. Timing problems may result in corrupted data being propagated through the integrated circuit, or may result in a metastable state in which the buffer output oscillates or signals that are electrically connected to the input buffer oscillate.

SUMMARY OF THE INVENTION

To address these and other deficiencies, the present application discloses a mixed mode input buffer that has reduced sensitivity so that a reference voltage can provide a more accurate means of switching.

In one embodiment, a mixed mode input buffer comprises an input transistor having at least a first terminal, a second terminal, and a gate terminal. The input transistor is configured to be connected to an externally generated input at the gate terminal. The mixed mode input buffer further comprises a first reference transistor having at least a first terminal, a second terminal, and a gate terminal. The first reference transistor is configured to be connected to an externally generated reference voltage signal at the gate terminal. The mixed mode input buffer further comprises a second reference transistor having at least a first terminal, a second terminal, and a gate terminal. The second reference transistor is connected to an internally generated reference voltage signal at the gate terminal.

In another embodiment, a method of operating an input buffer comprises accepting an first input to the input buffer from a first external source, the first external source being external to an integrated circuit, the input buffer being internal to the integrated circuit, and accepting a first reference voltage to the input buffer from a second external source, the second external source being external to the integrated circuit. The method further comprises accepting a second reference voltage from a first internal source, the first internal source being internal to the integrated circuit, and generating at least one output based at least in part on the first input, the first reference voltage, and the second reference voltage.

In another embodiment, an integrated circuit comprises a first input pad connected to a first conductor and a second input pad connected to a second conductor. The integrated circuit further comprises an input buffer including at least three inputs and at least one output, the at least three inputs being a first buffer input, a second buffer input, and a third buffer input, the first conductor being connected to the first buffer input and the second conductor being connected to the second buffer input. The integrated circuit further comprises a third conductor connecting the third buffer input to a first internal reference voltage generating circuit located on the integrated circuit.

In another embodiment, an input buffer with a reduced sensitivity to an externally generated reference voltage comprises: a first input coupled between a first load and ground, the first input being an externally generated reference voltage; a second input coupled between a second load and ground, for generating an output; and a third input coupled in parallel to the first input, the third input being an internally generated reference voltage; wherein the output switches between high and low or vice versa when the second input exceeds a switching point which is an average of the first input and the third input according to the relative size of the first input and the third input.

In another embodiment, an input buffer system with dynamic switchpoint calibration comprises: an input buffer for receiving an input and generating an output according to at least two reference voltages; an input pad, coupled to the input buffer, for generating the input to the input buffer; a voltage reference pad, coupled to the input buffer, for generating an external voltage reference to the input buffer; and a buffer, coupled to the output, for generating an internal reference voltage that is fed back to the input buffer; wherein the output switches between high and low or vice versa when the input exceeds a switching point which is an average of the external reference voltage and the internal reference voltage.

These and other embodiments of the present application will be discussed more fully in the description. The features, functions, and advantages can be achieved independently in various embodiments of the application, or may be combined in yet other embodiments.

DETAILED DESCRIPTION

In the following description, reference is made to the accompanying drawings that form a part thereof, and in which is shown by way of illustration specific exemplary embodiments in which the invention may be practiced. These embodiments are described in sufficient detail to enable those skilled in the art to practice the invention, and it is to be understood that modifications to the various disclosed embodiments may be made, and other embodiments may be utilized, without departing from the spirit and scope of the present invention. The following detailed description is, therefore, not to be taken in a limiting sense.

The mixed mode input buffer described herein utilizes two or more reference voltages to select a desired switching point for the input buffer. The switching point can advantageously be varied to any potential difference between the two or more reference voltages. In some embodiments, an input signal is compared with the average of the reference voltage signals. As a result, any noise in the reference voltage signals is also averaged.

Figure 1:
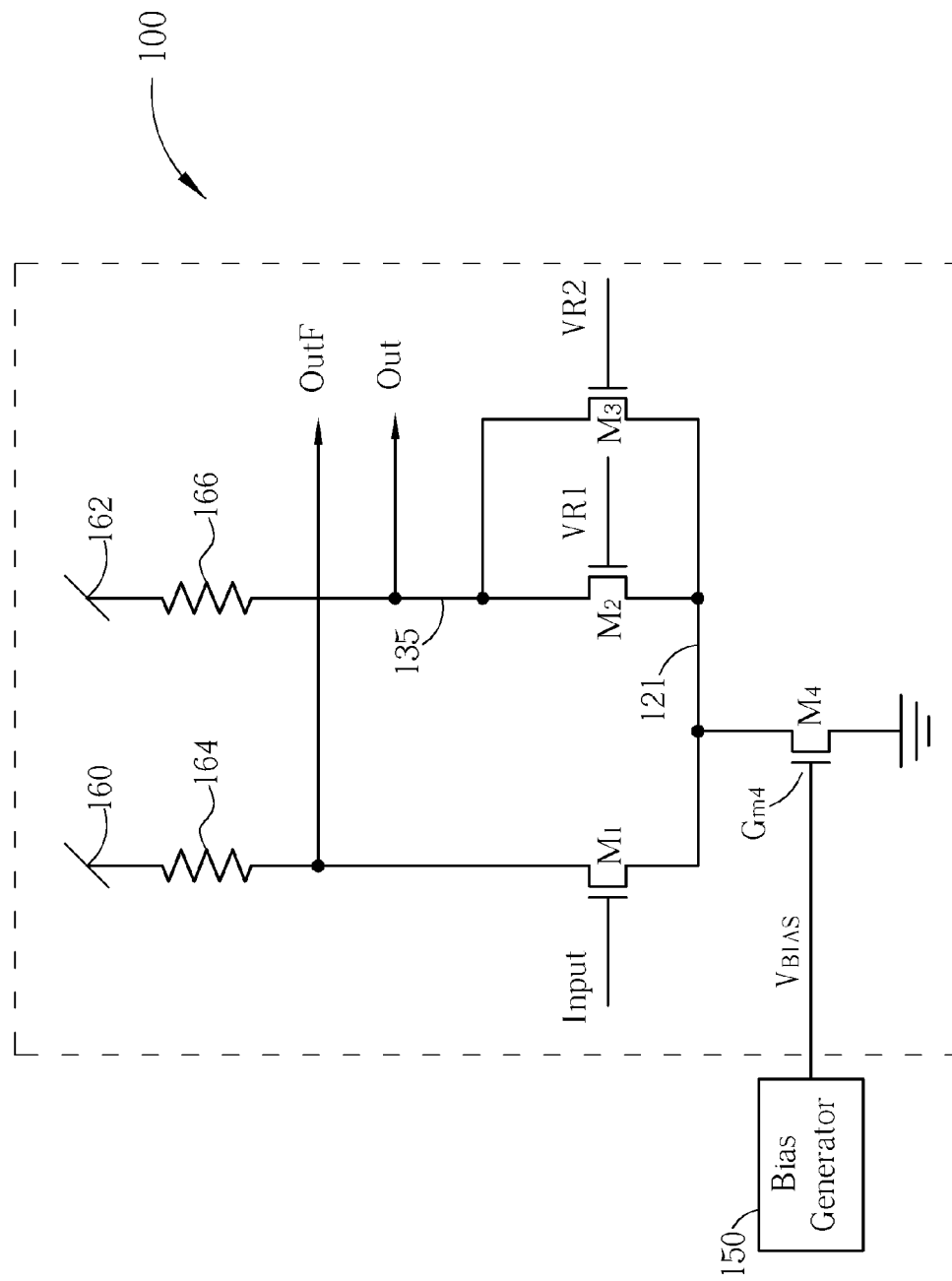
FIG. 1 illustrates a first exemplary embodiment of a mixed mode input buffer having a passive load configuration.

FIG. 1 illustrates a first exemplary embodiment of a mixed mode input buffer 100 having a passive load configuration. In the embodiment shown in FIG. 1, the input buffer 100 comprises four N-type FET transistors M1, M2, M3, M4. For clarity, the transistors M1-M4 are illustrated as each having only a gate, drain, and source terminal, though the transistors M1-M4 may comprise other connections (e.g., bulk connections). Those of ordinary skill in the art will understand that the designation of a terminal as either a "source" or a "drain" of a transistor is an arbitrary decision. Thus, in the description that follows, any terminal designated as a "source" could be designated as a "drain," and vice versa.

As shown in FIG. 1, an input signal ("Input") is coupled to the gate terminal of transistor M1. A first reference voltage, VR1, is coupled to the gate terminal of transistor M2, and a second reference voltage, VR2, is coupled to the gate terminal of transistor M3. The source terminals of transistors M1, M2, and M3 are each connected to a first common node 121. In addition, the drain terminal of transistor M4 is coupled to the first common node 121, and the source terminal of transistor M4 is coupled to an electrical ground, such as, for example, a digital ground, an analog ground, a chassis ground, or an earth ground. A bias generator 150 is coupled to transistor M4, at the gate GM4, via a bias signal line.

The drain terminals of transistors M2 and M3 are coupled to a second common node 135. Accordingly, transistors M2 and M3 are connected in parallel between the first common node 121 and the second common node 135, thereby forming a reference voltage network that sets the switch point of the output of the input buffer 100, as described in more detail below.

The input buffer 100 shown in FIG. 1 further comprises a first resistor 164 and a second resistor 166. The first resistor 164 is coupled between a first voltage source 160 and the drain terminal of transistor M1, and the second resistor 166 is coupled between a second voltage source 162 and the second common node 135. The resistors 164, 166 may each represent a discrete circuit element, or they may represent the resistance inherent in a conductor or transmission line, for example.

In operation, the input buffer 100 generates a first output signal ("OutF") and a second output signal ("Out") based on a received input signal ("Input"), which may be an externally generated signal, such as a data signal or a control signal. Generally, the second output signal ("Out") represents a scaled version of the input signal, and the first output signal ("OutF") represents an inverted scaled version of the input signal. Thus, the first and second output signals make up a differential signal pair that may be used to propagate the input signal to other parts of an integrated circuit.

The reference voltage network comprising transistors M2, M3 in FIG. 1 can be designed to affect the switch point of the first and second output signals of the input buffer 100. In some embodiments, the drive strength and width of each transistor M2, M3 can determine the manner in which the transistor M2, M3 influences the output signals. For example, if M2 is about twice the width of M3, then M2 may have about twice the drive strength of M3, and thus, may have a greater influence on the switch point of the output signals.

In some embodiments, the sum of the widths of transistors M2 and M3 is designed to match the width (and hence the drive strength) of transistor M1. However, the widths of M2 and M3 are not necessarily designed to match each other. For example, in the case that VR1 is expected to be generally stable, M2 may be chosen to be 75% of the size of M1, while M3 may be chosen to be 25%. Thus, M2 will have a greater influence on the switch point. In another example, VR1 may be expected to be moderately noisy. As such, both M2 and M3 may be matched (i.e., M2 and M3 both have a width of 50% of the width of M1). Additionally, in cases where VR1 is expected to be very stable or very unstable, M3 can be omitted or M2 can be omitted, respectively.

Additionally, the drive strength of a transistor can be changed by varying an input on the gate of the transistor, if the transistor is being operated in the triode region (for MOSFETs). When a transistor is operated in the triode region, it may be used as a variable current limiter. Although FIG. 1 generally shows MOSFET type transistors, other switching devices, such as, for example, BJT type transistors operated in the saturation region or other suitable transistors, may be used in place of MOSFETs, as would be apparent to one of ordinary skill in the art, given the benefit of this disclosure.

As an example of the operation of the input buffer 100 shown in FIG. 1, in some embodiments, VR1 is at ground and VR2 is at 0.5V. If the switching point is 50% between VR1 and VR2 (e.g., the total width of transistors M2 and M3 is equal to the width of transistor M1, and transistors M2 and M3 are of equal width) then the output signals will switch once the input signal reaches 0.25V. The same is true if VR1 is at 0.5V and VR2 is at ground. Alternatively, if VR1 and VR2 were designed to be the same voltage (e.g., both are 0.5V) then the switching point would be at 0.5V, and the input buffer 100 would operate in the same way as a conventional single ended input buffer.

The two reference voltages VR1, VR2 can be generated in different ways. In some embodiments, VR1 is an externally generated voltage and VR2 is an on-chip, internally generated reference voltage. This type of configuration not only reduces the noise on VR1 but also allows VR1 and VR2 to easily be shorted together, so that the configuration can operate as a conventional single ended input buffer, if desired.

FIG. 1 illustrates an example of a mixed mode input buffer 100 having a passive load configuration. In this configuration, the reference voltage network can be designed to generate 50% mixing between VR1 and VR2. As described above, the passive load configuration may also operate with different percentage mixing of reference voltage signals. For example, VR1 may comprise 75% of the load, and VR2 may comprise 25% of the load.

Figure 2:
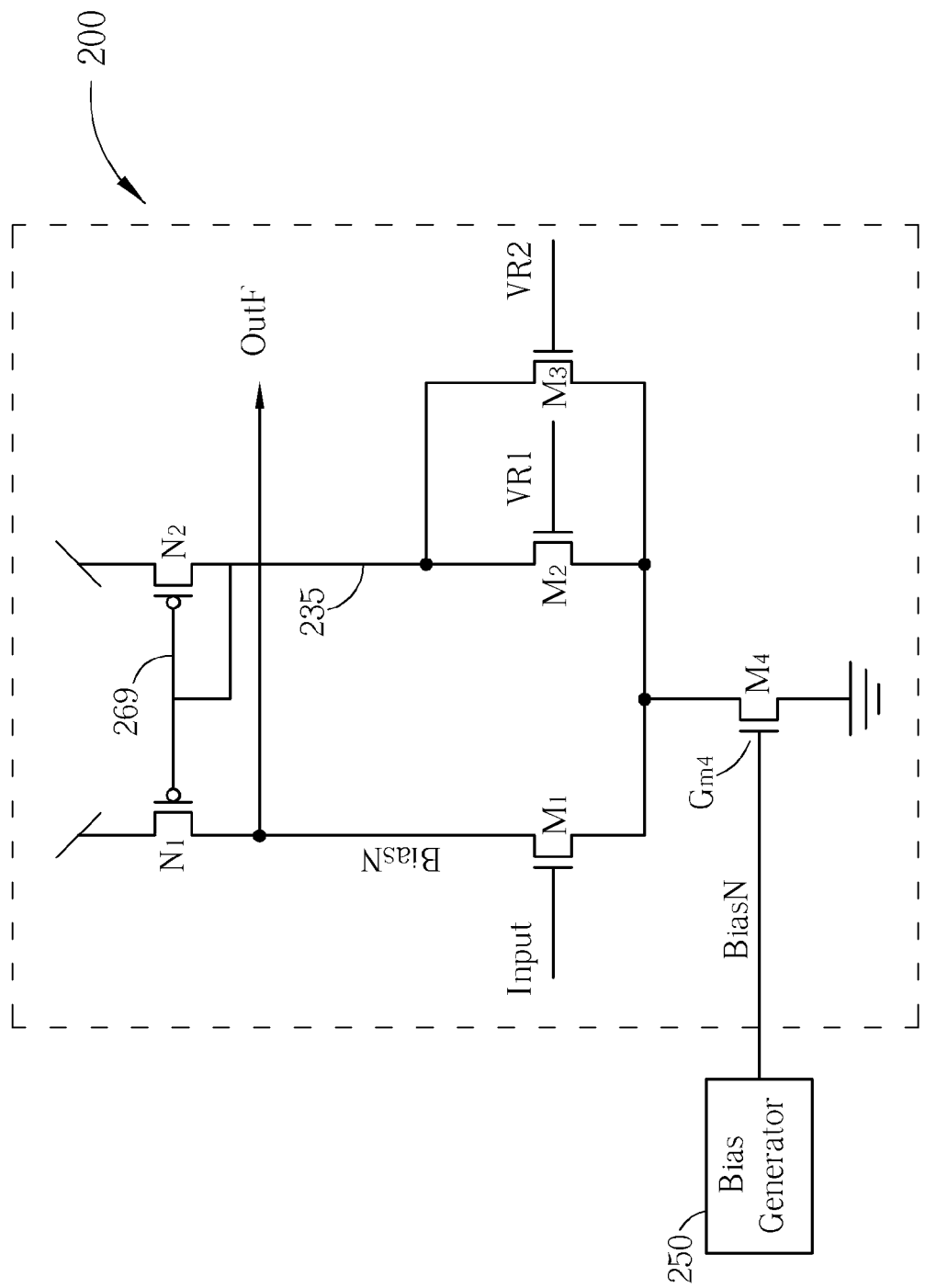
FIG. 2 illustrates a second exemplary embodiment of a mixed mode input buffer having a basic Operational Transconductance Amplifier (OTA) configuration.

FIG. 2 illustrates a second exemplary embodiment of a mixed mode input buffer 200. In the embodiment shown in FIG. 2, the input buffer 200 has a basic Operational Transconductance Amplifier (OTA) configuration. The input buffer 200 has a similar design to that described above in connection with FIG. 1, however the resistors 164, 166 have been replaced by internal loads N1 and N2, which comprise P-type MOSFETs in the illustrated embodiment. In some embodiments, M2 and M3 are designed such that VR2 comprises 25% of the total reference voltage.

Figure 3:
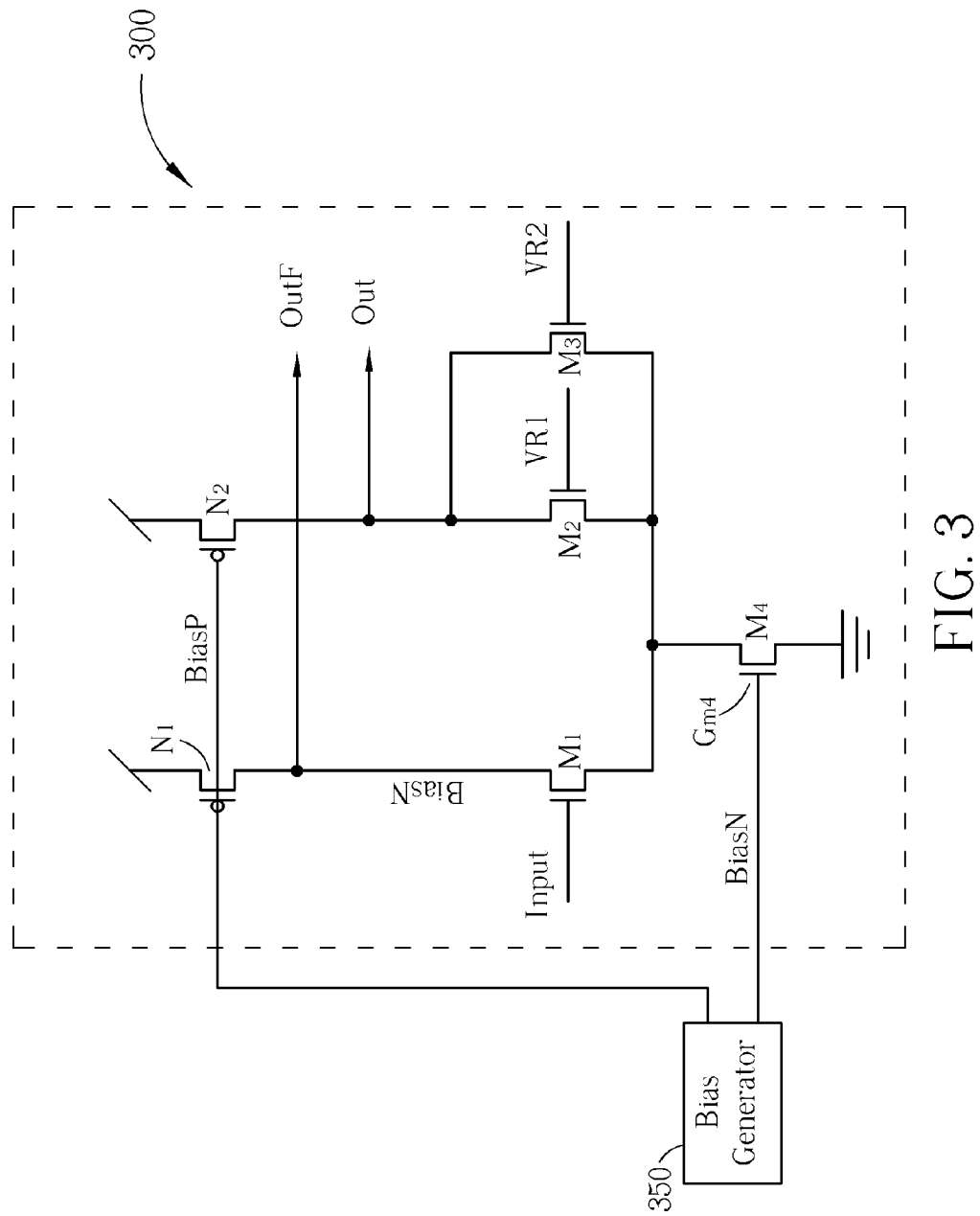
FIG. 3 illustrates a third exemplary embodiment of a mixed mode input buffer having an active load configuration.

FIG. 3 illustrates a third exemplary embodiment of a mixed mode input buffer 300. In the embodiment shown in FIG. 3, the input buffer 300 has an active load configuration. A bias generator 350 supplies a bias signal ("BiasN") to transistor M4 at gate GM4, and also supplies a bias signal ("BiasP") to the loads N1, N2. In some embodiments, M2 and M3 are designed such that VR2 provides 25% of the total reference voltage.

Figure 4:
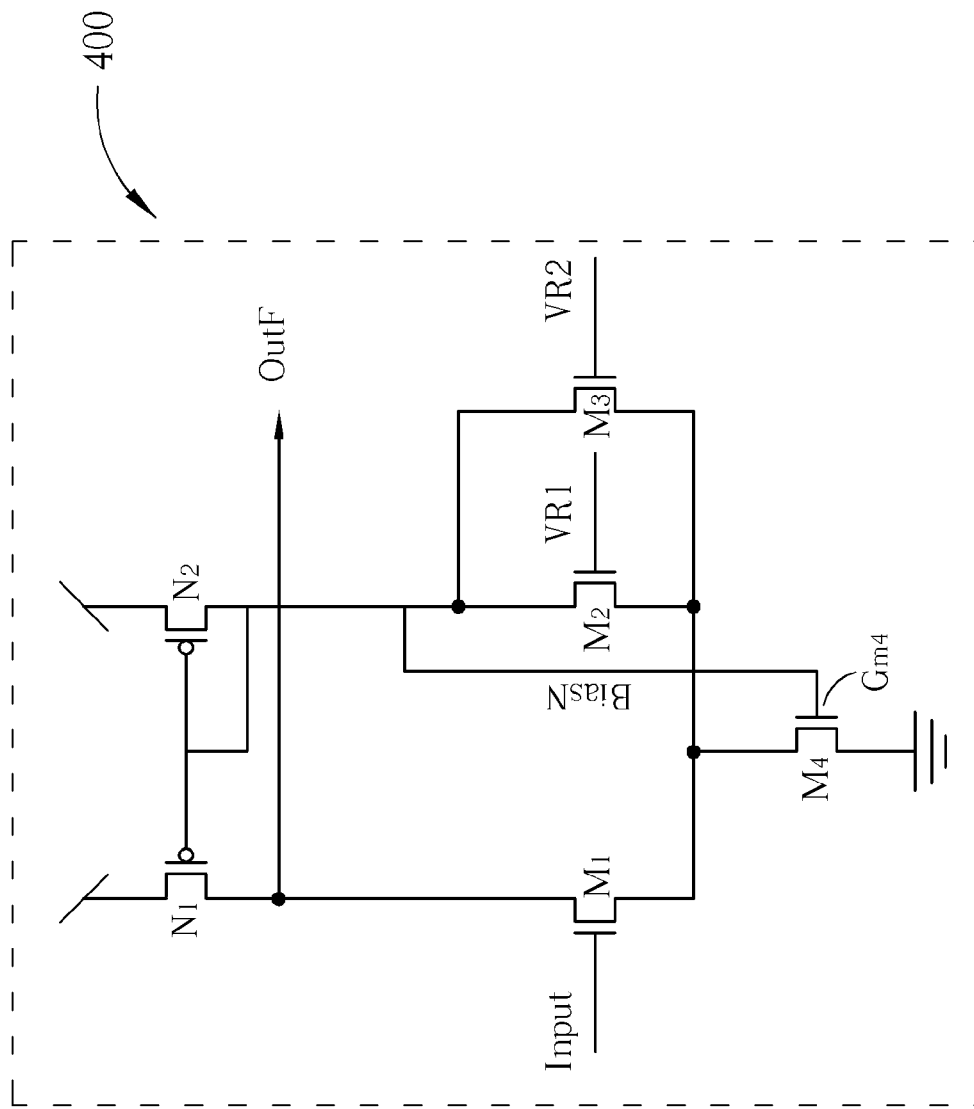
FIG. 4 illustrates a fourth exemplary embodiment of a mixed mode input buffer having a basic OTA configuration with a self-generated bias voltage.

FIG. 4 illustrates a fourth exemplary embodiment of a mixed mode input buffer 400. In the embodiment shown in FIG. 4, the input buffer 400 has a basic OTA configuration with a self-generated bias voltage. Specifically, the input buffer 400 has internal loads N1, N2 configured in accordance with the basic OTA architecture shown in FIG. 2. The difference between FIG. 2 and FIG. 4 is that the bias signal ("BiasN") provided to M4 at gate GM4 is internally generated by the input buffer 400. Again, in some embodiments, M2 and M3 are designed such that VR2 comprises 25% of the total reference voltage.

Figure 5:
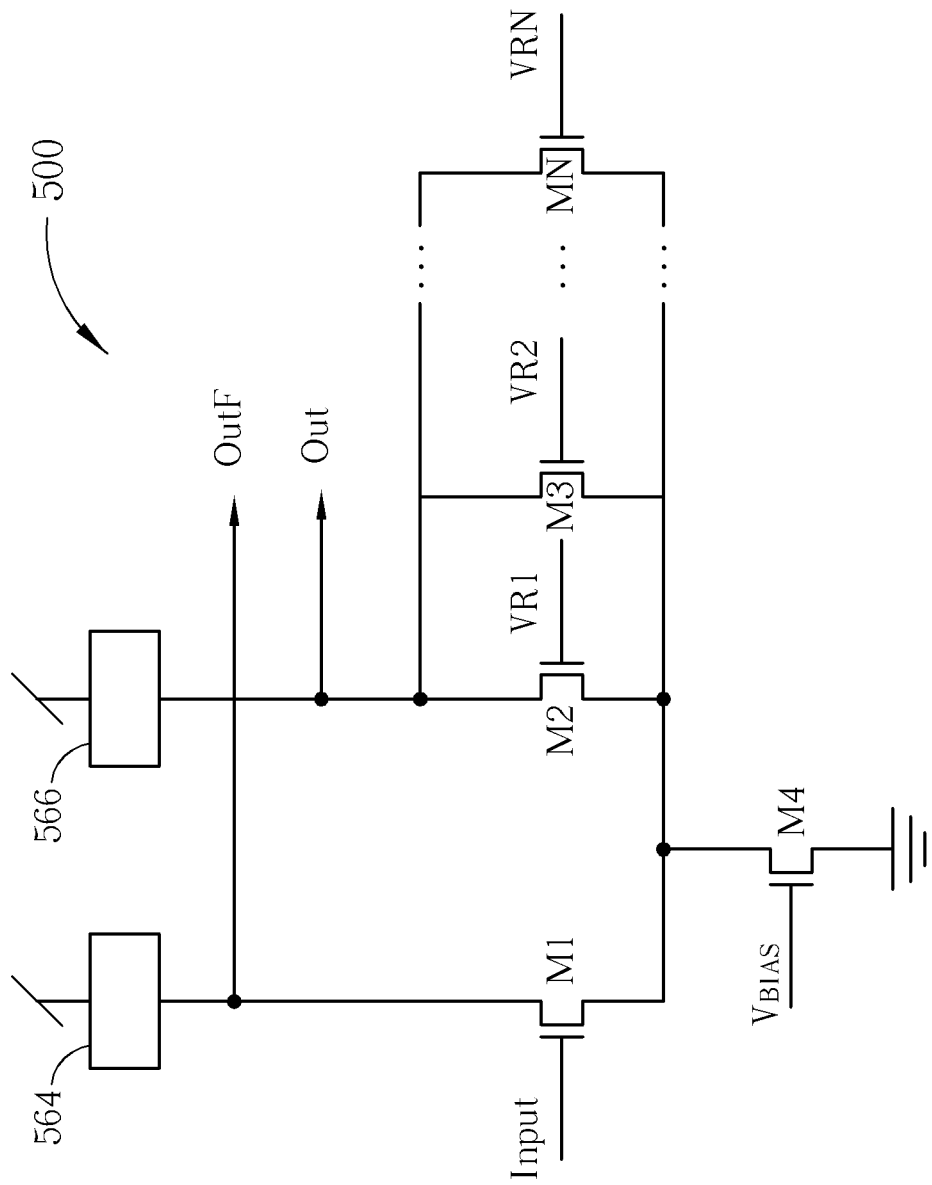
FIG. 5 illustrates an exemplary embodiment of a mixed mode input buffer with multiple reference voltage signals.

FIG. 5 illustrates an exemplary embodiment of a mixed mode input buffer 500 having multiple reference voltage signals, VR1, VR2, ..., VRN. In some embodiments, VR1 is an external reference voltage signal, while all the remaining reference voltage signals are generated internally. In some embodiments, additional reference voltages may be generated internally and/or externally.

The input buffer 500 comprises a plurality of voltage reference transistors M2, M3, ..., MN connected in parallel with one another. The gates of these transistors may be sized as desired to weight the effect of each transistor on a switch point, the switch point being set by a weighted combination, or weighted average, of the voltage reference transistors M2, M3, ..., MN. The input buffer 500 also comprises a first generic load 564 and a second generic load 566, which may each comprise one or more passive or active electrical elements.

Figure 6:
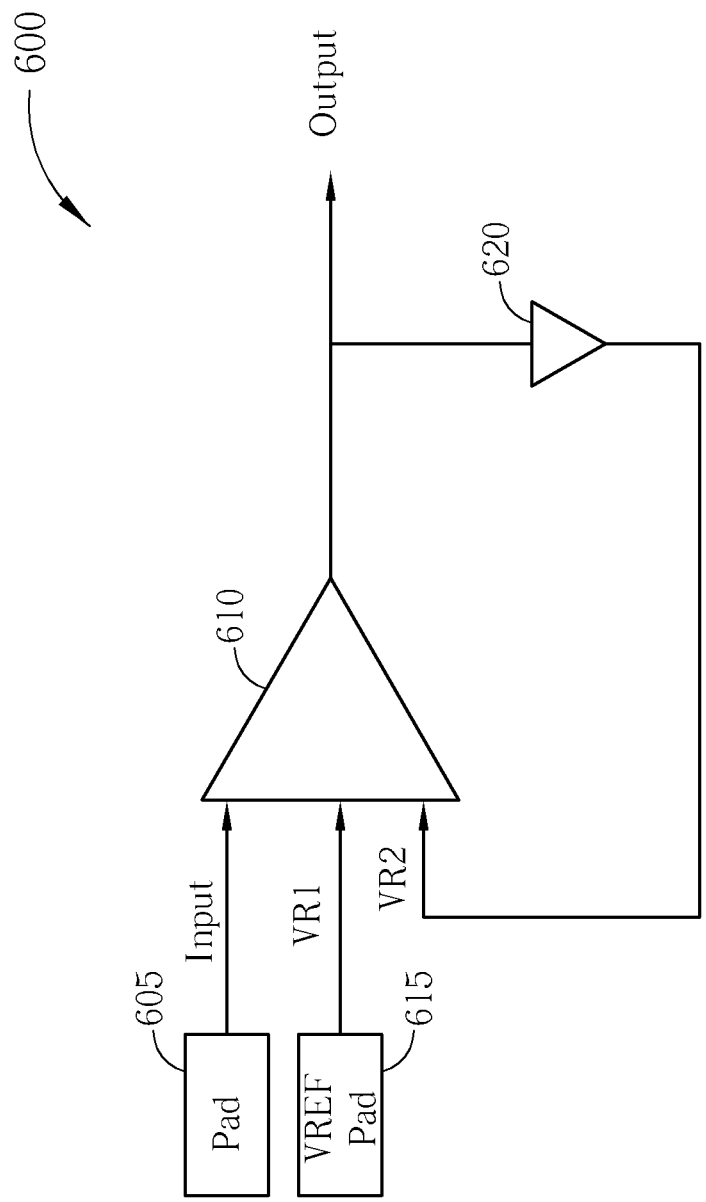
FIG. 6 illustrates an exemplary embodiment of a mixed mode input buffer system that utilizes a feedback mechanism.

FIG. 6 illustrates an exemplary embodiment of a mixed mode input buffer system 600 that utilizes a feedback mechanism. In the embodiment shown in FIG. 6, the input buffer system 600 comprises an input buffer 610, which receives an input signal ("Input") generated from an input pad 605, and a first reference voltage, VR1, generated from a voltage reference pad 615.

In operation, the input buffer 610 generates an output signal ("Output"), which is input to a second buffer 620. The second buffer 620, in turn, generates an output signal, VR2, which is fed back to the input buffer 610 as an internally generated reference voltage. This feedback mechanism causes the switchpoint of the input buffer 610 to be dynamically switched according to the initial switching speed of the input buffer 610. Negative feedback will slow down the input buffer 610, so that the input buffer 610 will switch after the switching point. Positive feedback will speed up the input buffer 610 by switching the output before the switching point.

By exploiting the hysteresis effect, i.e., using positive or negative feedback, the input buffer system 600 can be calibrated as desired. For example, the effect of the hysteresis can be set by designing the parameters of one or more circuit elements, such as the width of transistors that are internal to the input buffer 610. Additionally, the direction of the shift of the switch point can be set by varying the voltage input to the input buffer 610 (see diagrams shown in FIGS. 7-9). Thus, with a feedback configuration, the behavior of the input buffer system 600 may be advantageously adjusted in response to a change in output.

Those of ordinary skill in the art will understand that any of the exemplary embodiments illustrated in FIGS. 1-4, or other embodiments, could be adapted to have a plurality of reference voltage signals, as shown in FIG. 5, and/or a feedback mechanism, as shown in FIG. 6.

Figure 7:
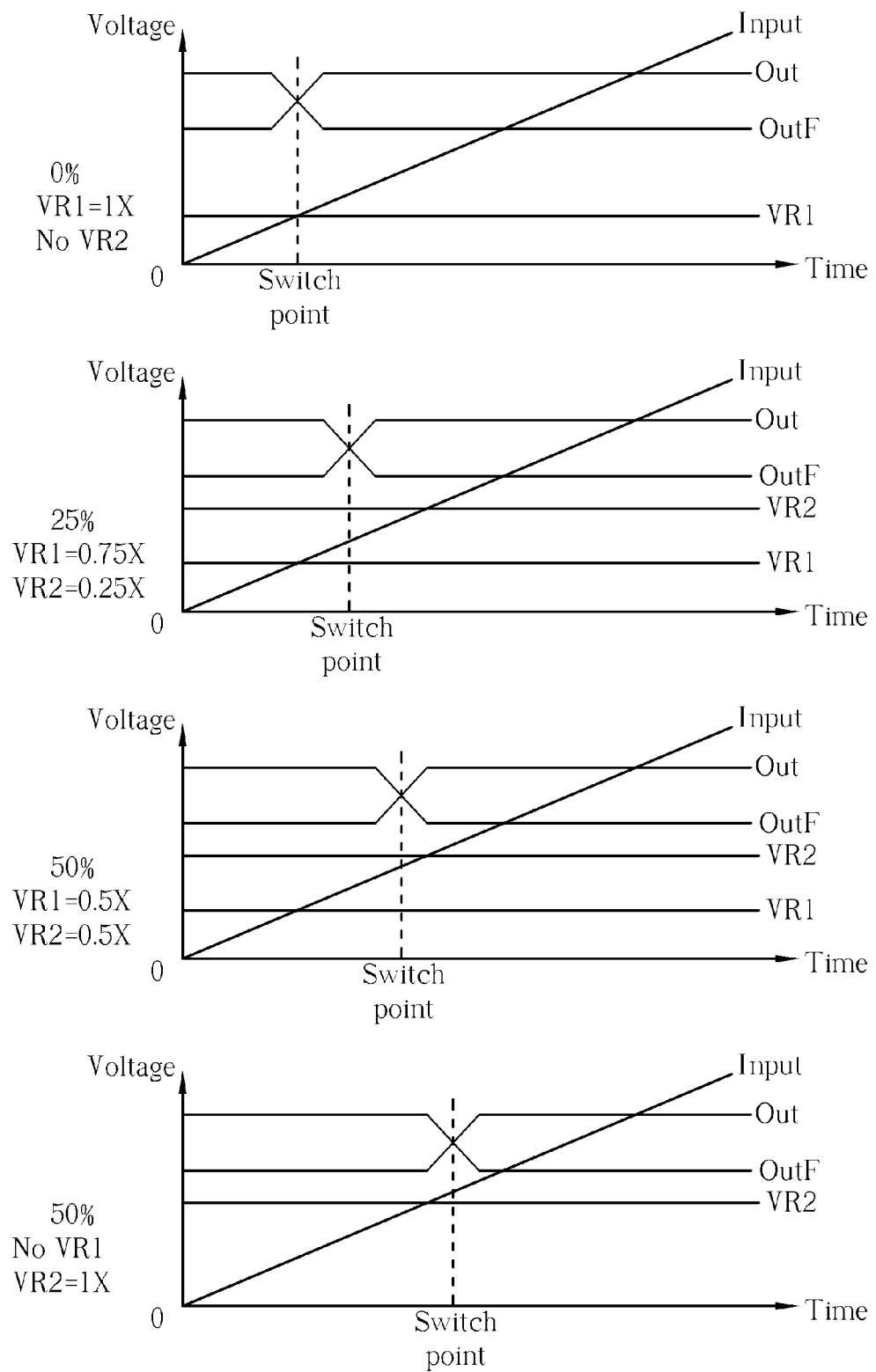
FIG. 7-9 illustrate switching point diagrams of an input buffer with an external reference voltage only, an input buffer with 50% reference mixing between a first and a second reference voltage, an input buffer with 75:25% reference mixing between a first and a second reference voltage, and an input buffer with an internal reference voltage only.
Figure 8:
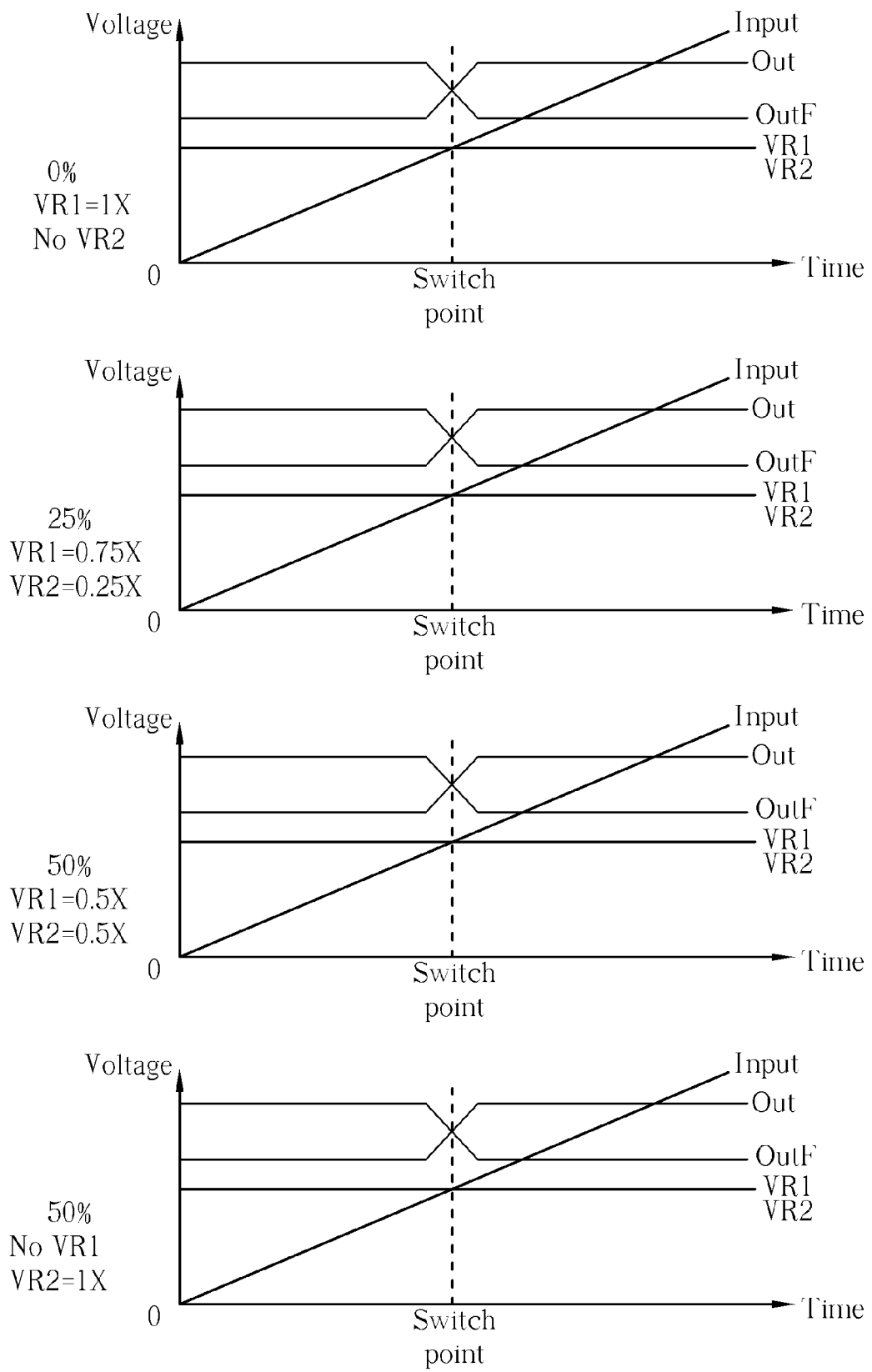
Figure 9:
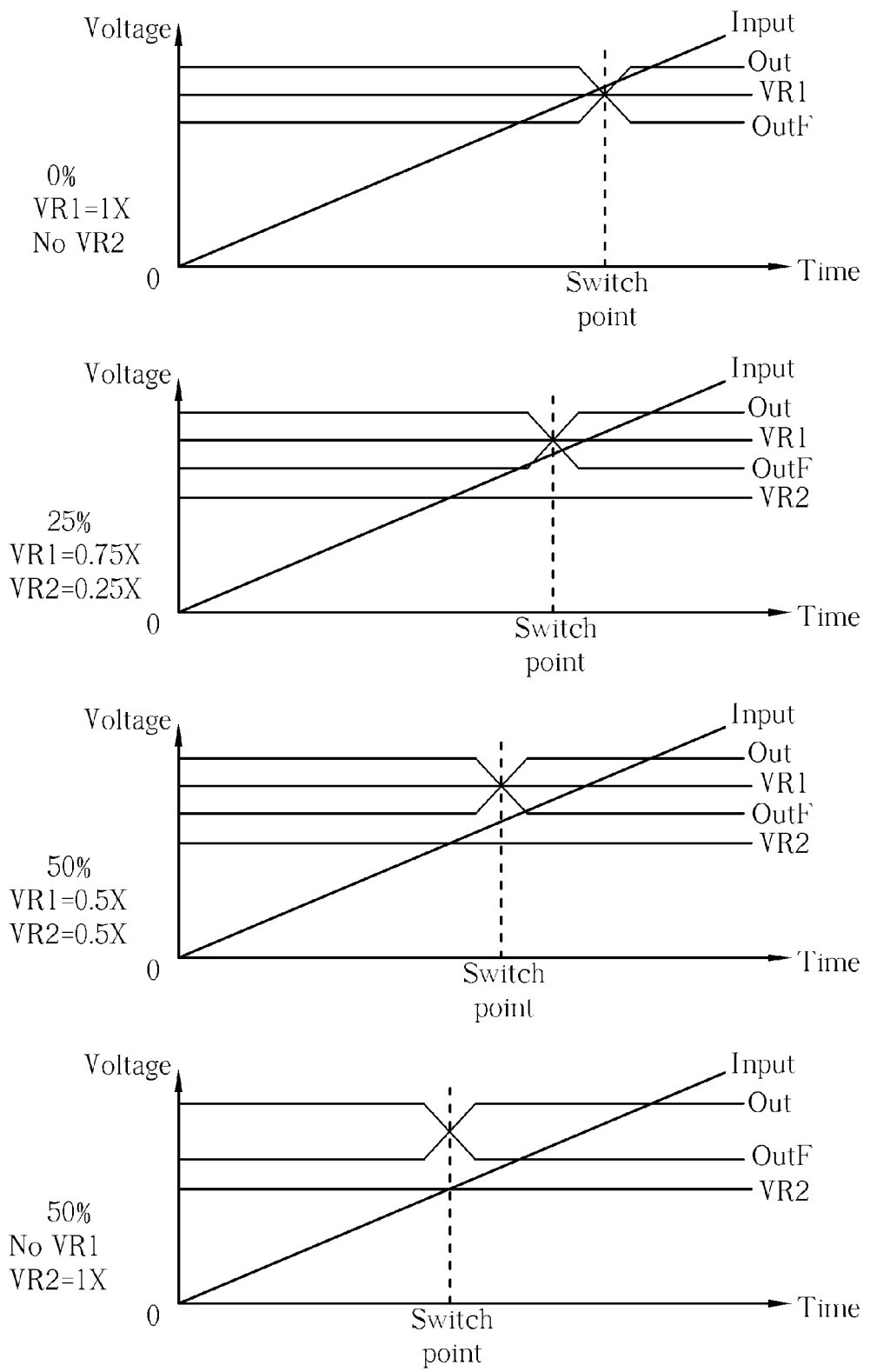

FIGS. 7-9 illustrate switching point diagrams for different exemplary embodiments of mixed mode input buffers, as described above. For example, FIG. 7 illustrates four switching point diagrams showing the behavior of four different embodiments of an input buffer, where a first reference voltage signal, VR1, is set at a relatively low voltage level. The first diagram shows the switch point of an input buffer with no second reference voltage signal, VR2. The second diagram shows the switch point of an input buffer with VR2 comprising 25% of the reference voltage. The third diagram shows the switch point of an input buffer with 50% mixing of VR1 and VR2. The fourth diagram shows the switch point of an input buffer with no VR1.

It should be noted that, as the percentage reference mixing of VR1 and VR2 varies (by adjusting the width of transistors M2 and M3, for example), the switch point travels. As such, the switch point is determined by a weighted combination or average of the relative influence of the transistors in the reference voltage network.

FIG. 8 shows four similar switching point diagrams to those shown in FIG. 7, with the first reference voltage signal, VR1, set at a medium voltage level. FIG. 9 also shows four similar switching point diagrams, with the first reference voltage signal, VR1, set at a relatively high voltage level. It should be noted that the switching point remains constant in each of the fourth diagrams shown in FIGS. 7-9, because these diagrams show the switch point of an input buffer with no VR1.

In summary, the mixed mode input buffers described above present distinct advantages over existing input buffers. For example, the mixed mode input buffers reduce sensitivity to an externally generated reference voltage, by mixing the externally generated reference voltage with an internally generated reference voltage. This mixing effect reduces the sensitivity of the buffer while still enabling its output to be tracked with the externally generated reference voltage. In addition, the mixed mode input buffers in some embodiments allow for a dynamic switching point, and further enable calibration, by utilizing the buffer output as the internally generated reference voltage. The resulting feedback advantageously enables the switching point of the input buffer to be dynamically calibrated.

Although the mixed mode input buffer is described in terms of certain preferred embodiments, other embodiments will be apparent to those of ordinary skill in the art, given the benefit of this disclosure, including embodiments that do not provide all of the benefits and features set forth herein, which are also within the scope of this application. It is to be understood that other embodiments may be utilized, and that many circuits that utilize the concept of this mixed mode input buffer can be designed and fabricated, including those that optimize the programming of and the use of the programmable resistor, without departing from the spirit and scope of the present application.

What is claimed is:

1. A mixed mode input buffer for providing an output signal that is switched between a high level and a low level according to a signal comparison, comprising:

an input transistor having at least a first terminal, a second terminal, and a gate terminal, and connected to an externally generated input at the gate terminal, for providing a first signal according to at least the externally generated input;

a first reference transistor having at least a first terminal, a second terminal, and a gate terminal, and connected to an externally generated reference voltage signal at the gate terminal, where the second terminal of the first reference transistor is coupled to the second terminal of the input transistor, and the first reference transistor is for providing a second signal according to at least the externally generated reference voltage signal; and a second reference transistor having at least a first terminal, a second terminal, and a gate terminal, and connected to an internally generated reference voltage signal at the gate terminal and coupled in parallel to the first reference transistor, the second reference transistor for providing a third signal according to at least the internally generated reference voltage signal;

wherein the first signal is compared with a combination of the second signal and the third signal, and when the first signal is greater than the combination of the second signal and the third signal, the output signal of the mixed mode input buffer is switched between the high level and the low level; and wherein sum of the widths of the first reference transistor and the second reference transistor is substantially equal to width of the input transistor.

2. The mixed mode input buffer of claim 1, wherein the second terminals of the input transistor, the first reference transistor, and the second reference transistor are connected to a first common node.

3. The mixed mode input buffer of claim 1, further comprising:

a first load connecting a first voltage terminal to a first terminal of the input transistor;

a second load connecting a second voltage terminal to a second common node, the second common node connecting to the first terminal of the first reference transistor and to the first terminal of the second reference transistor; and a third load connected to a third voltage terminal, and coupled to the first common node;

wherein the first and second voltage terminals are held at a positive voltage relative to the third voltage terminal; and wherein the first and second voltage terminals are held at substantially the same voltage.

4. The mixed mode input buffer of claim 3, wherein the first voltage terminal and the second voltage terminal are operatively connected.

5. The mixed mode input buffer of claim 3, wherein the third load is a bias transistor having at least a first terminal, a second terminal, and a gate terminal.

6. The mixed mode input buffer of claim 5, wherein the bias transistor is connected to an externally generated bias signal.

7. The mixed mode input buffer of claim 5, wherein the bias transistor is connected to an internally generated bias signal.

8. The mixed mode input buffer of claim 7 wherein the internally generated bias signal is generated at least in part in response to the output signal.

* * * * *